United States Patent [19]

Minakuchi

[11] 4,296,407
[45] Oct. 20, 1981

[54] DIGITAL FREQUENCY SYNTHESIZER WITH FREQUENCY DIVIDER PROGRAMMABLE IN RESPONSE TO STORED DIGITAL CONTROL SIGNAL

[75] Inventor: Hiroshi Minakuchi, Osaka, Japan

[73] Assignee: Matsushita Electric Industrial Co., Osaka, Japan

[21] Appl. No.: 38,991

[22] Filed: May 14, 1979

[51] Int. Cl.³ .................... H03L 7/18; H03K 13/20
[52] U.S. Cl. ................. 340/347 CC; 340/347 M; 340/347 AD; 235/97 PE; 235/92 PL; 328/14; 331/1 A
[58] Field of Search ............... 328/14; 307/271, 261; 331/1 A; 340/347 AD, 347 CC, 347 M; 235/92 PE, 92 PL, 92 CA

[56] References Cited

U.S. PATENT DOCUMENTS

| | | | |
|---|---|---|---|
| 3,764,831 | 10/1973 | Zwitter et al. | 307/271 |
| 3,790,910 | 2/1974 | McCormack | 235/92 PL |
| 3,800,236 | 3/1974 | Riethmuller et al. | 340/347 CC |
| 3,913,028 | 10/1975 | Busselaers | 331/1 A |
| 3,918,048 | 11/1975 | Omura | 340/347 AD |
| 4,127,766 | 11/1978 | Thayer | 235/92 CA |
| 4,140,925 | 2/1979 | Meyer | 340/347 CC |
| 4,192,993 | 3/1980 | Wechsler | 235/92 PE |

OTHER PUBLICATIONS

*Analog–Digital Conversion Handbook,* published by Analog Devices Inc., Lib. of Cong. Catalog No. 72-85817, "Counter and Servo Types", pp. II, 51 and 52.

*Primary Examiner*—John S. Heyman
*Attorney, Agent, or Firm*—Pollock, VandeSande & Priddy

[57] ABSTRACT

A digital frequency synthesizer comprises a programmable frequency divider, an analog-to-digital converter for converting an analog program control signal into a digital signal, and a digital storage medium for storing the digital signal to control the frequency division ratio of the programmable frequency divider in accordance with the digital value of the stored signal.

10 Claims, 6 Drawing Figures

DIGITAL FREQUENCY SYNTHESIZER WITH FREQUENCY DIVIDER PROGRAMMABLE IN RESPONSE TO STORED DIGITAL CONTROL SIGNAL

BACKGROUND OF THE INVENTION

The present invention relates to a digital frequency synthesizer which is immune to small variations of an analog program control signal to maintain the frequency division ratio constant when the variations lie within a predetermined range.

Conventional frequency synthesizers of the type which employs a programmable frequency divider make use of an analog-to-digital converter for converting an analog program control signal into a digital signal for controlling the frequency division ratio of the programmable frequency divider. However, the inherent small variation of the analog control signal tends to adversely affect the frequency division ratio.

SUMMARY OF THE INVENTION

Accordingly, an object of the invention is to overcome the aforesaid problem by incorporating a memory device for storing the digital signal to maintain the program input constant regardless of the presence of insignificant variations of the analog control signal.

BRIEF DESCRIPTION OF THE DRAWINGS

The present invention will be further described by way of example with reference to the accompanying drawings, in which.

DETAILED DESCRIPTION

Figure 1:
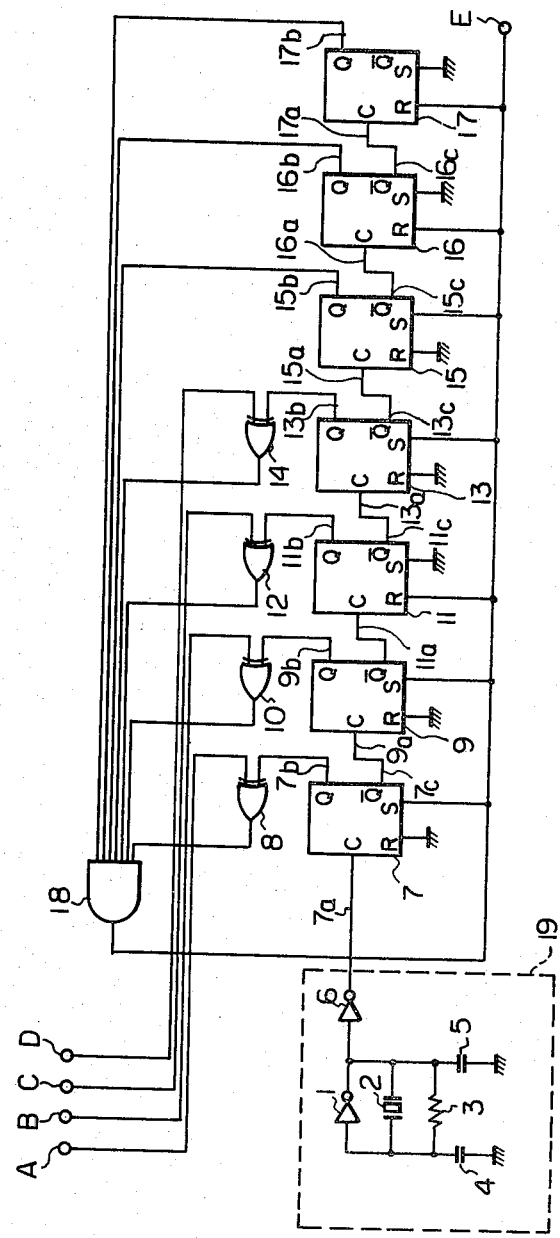
FIG. 1 is a block diagram of a prior art frequency synthesizer.

Before describing the present invention reference is first made to FIG. 1 in which a prior art frequency demultiplier or divider is illustrated. In FIG. 1, reference numeral 1 is an inverter, which together with a crystal quartz oscillator element 2, resistance 3 and capacitors 4 and 5 constitutes an oscillator. An inverter 6 is provided which serves as a buffer amplifier whose output is connected to the clock input terminal 7a of a flip-flop 7. To the output terminal 7b of the flip-flop 7 is connected an input terminal of an Exclusive-OR gate 8, and to the complementary output terminal 7c of the flip-flop 7 is connected the clock input terminal 9a of a flip-flop 9. To the true output terminal 9b of the flip-flop 9 is connected an input terminal of an Exclusive-OR gate 10 and to the complementary output 9c of the flip-flop 9 is connected the clock input terminal 11a of a flip-flop 11. To the true output terminal 11b of the flip-flop 11 is connected an input terminal of an Exclusive-OR gate 12 and to the complementary output terminal 11c of the flip-flop 11 is connected the clock input terminal 13a of a flip-flop 13. To the true output terminal 13b of the flip-flop 13 is connected an input terminal of an Exclusive-OR gate 14 and to the complementary output 13c of the flip-flop 13 is connected the clock input terminal 15a of a flip-flop 15. To the complementary output 15c of the flip-flop 15 is connected the clock input terminal 16a of a flip-flop 16 whose complementary output 16c is connected to the clock input terminal 17a of a flip-flop 17.

Furthermore, another input terminal of each of the Exclusive-OR gates 8, 10, 12 and 14 is connected to program input terminals A, B, C and D, respectively. The output terminals of these Exclusive-OR gates and the true output terminals 15b, 16, and 17b of flip-flops 15, 16 and 17 are connected to respective input terminals of an AND gate 18 whose output terminal is connected to the set input terminals of flip-flops 7, 9, 13 and 15 and also to the reset input terminals of flip-flops 11, 16 and 17, and further to an output terminal E of the frequency divider.

Each of the flip-flops 7, 9, 11, 13, 15, 16 and 17 is designed to switch to logic "1", which appears as a high voltage level at the true output terminal, in response to the leading or positive edge of an input clock pulse when the set and reset input terminals are both at logic "0" or low voltage level, and also switch to logic "1" when each flip-flop receives a logic "1" signal at its set input terminal regardless of the binary state of its clock input terminal, and switch to logic "0" level whenever a logic "0" signal is applied to the reset input regardless of the binary state of the clock input terminal.

Assuming that a set of binary signals "0000" is applied to the program input terminals, D, C, B and A, each flip-flop generates a logic "1" output, so that the output of the AND gate 18 is switched to logic "1", causing flip-flops 17, 16, 15, 13, 11, 9 and 7 to reset to logic levels "0 0 1 1 0 1 1", respectively. In other words, the output terminal E is preset to a set of binary states "0011011" which is a decimal value of "27" when all the flip-flops are at logic level "1 1 1 1 1 1 1" equivalent to a decimal value of "127", whereby the frequency divider changes its binary state in 100 discrete steps starting from the decimal value 27 to the decimal value 127. Therefore the output frequency of the driver is 1/100 of the input frequency.

Assuming next that the program input is changed to "0001", the flip-flops will be reset to "0 0 1 1 0 1 1" as counted from flip-flop 17 down to flip-flop 7 when these flip-flops are at logic levels "1 1 1 1 1 1 0", respectively. In this case, the frequency divider is preset to a division ratio of 1/99. In the same manner, a program signal of "1111" will produce a set of logic levels "1 1 1 0 0 0 0" which cause the flip-flops to change to "0 0 1 1 0 1 1", presetting the frequency divider to a ratio of 1/85. As seen from Table I, as the program input is varied with a step of binary digit "1" from decimal "0" to decimal "10", for example, with corresponding frequency division ratios from 1/100 to 1/90 and the input frequency is set at 100 kHz, the output frequency varies from 1000 Hz to 1111 Hz with a variation ranging from +0.000 to +11.111%.

TABLE I

| PROGRAM INPUT | | DIVISION RATIO | OUTPUT FREQUENCY (Hz) | VARIATION (%) |
|---|---|---|---|---|
| DECIMAL | BINARY "DCBA" | | | |
| 0 | 0000 | 1/100 | 1000 | +0.000 |
| 1 | 0001 | 1/99 | 1010 | +1.010 |
| 2 | 0010 | 1/98 | 1020 | +2.041 |
| 3 | 0011 | 1/97 | 1031 | +3.093 |
| 4 | 0100 | 1/96 | 1042 | +4.167 |
| 5 | 0101 | 1/95 | 1053 | +5.263 |
| 6 | 0110 | 1/94 | 1064 | +6.383 |
| 7 | 0111 | 1/93 | 1075 | +7.527 |
| 8 | 1000 | 1/92 | 1087 | +8.696 |
| 9 | 1001 | 1/91 | 1099 | +9.890 |
| 10 | 1010 | 1/90 | 1111 | +11.111 |

If the digital frequency synthesizer of FIG. 1 is employed as a standard variable frequency source in a radio tuner or motor control system, It is desirable that the output frequency be instantly varied in response to the control signal and that the control data be not lost even when power is turned off.

For this purpose the use of an analog-to-digital converter may be employed to convert a voltage developed across a variable resistor into a digital value and the latter is used as a control signal for altering the frequency division ratio. However, the voltage developed across the variable resistor tends to fluctuate in response to noise or aging of the variable resistor. This introduces an error in the analog control value which results in an error of at least one digital count.

For example, if the user makes and adjustment to the analog control value so that the output frequency of the system of FIG. 1 undergoes a frequency shift of 2%, the corresponding digital control value may fluctuate between "0 0 0 1" and "0 0 1 0" or between "0 0 1 0" and "0 0 1 1", and as a result the output frequency discretely varies between 1% and 2% values or between 2% and 3% values as seen from Table I. In other words, the system as a whole has a low degree of precision due to the inherent fluctuation factors which are present in the interface between analog and digital systems, even though a high precision type frequency oscillator such as crystal controlled oscillator is employed as a standard frequency source.

Figure 2:
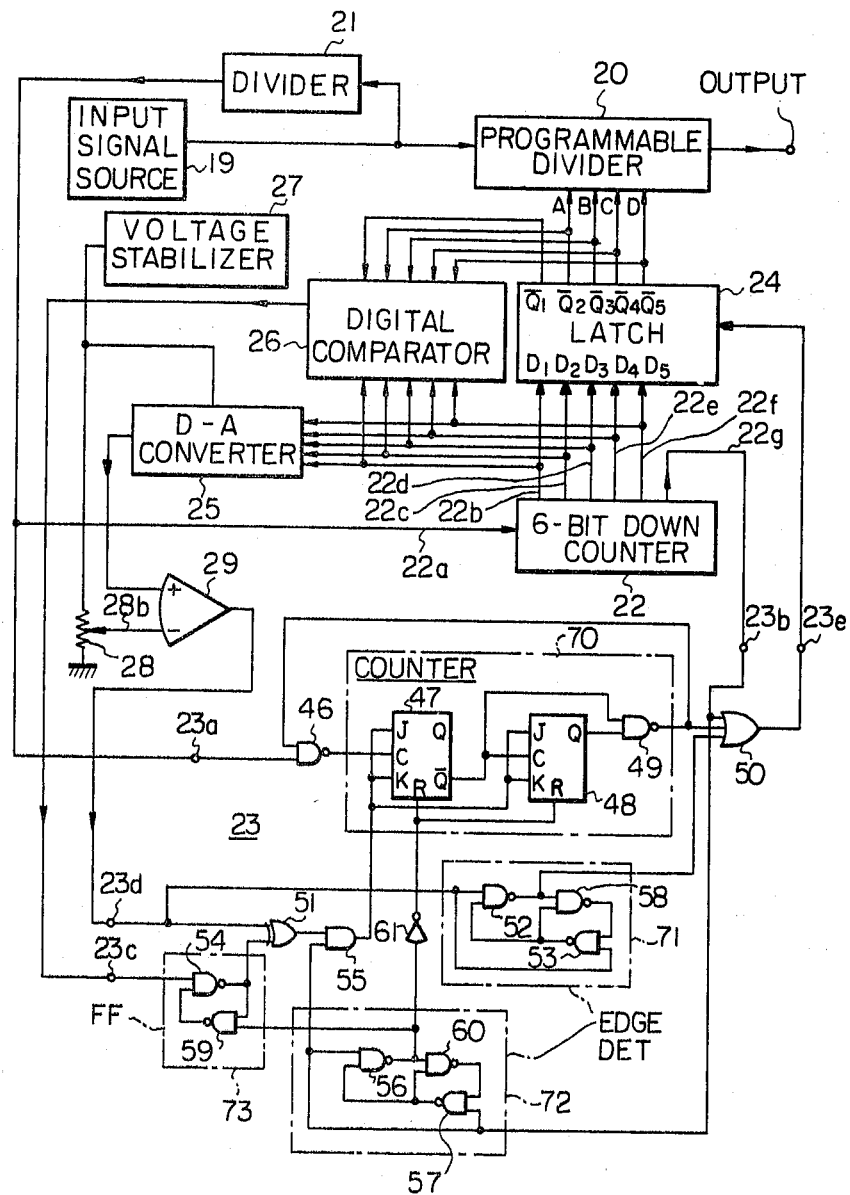
FIG. 2 is a block diagram of a frequency synthesizer of the invention.

The present invention will now be described with reference to FIG. 2. The system of FIG. 2 comprises a programmable frequency divider 20 which receives input clock pulses from a clock source or any external signal source 19 and delivers frequency-divided output signal on terminal 20a depending on a set of binary states of its input terminals A, B, C and D arranged in the order from the least significant bit to the most significant bit. A frequency divider 21 is provided which divides the frequency of the input signal source 19 with a fixed division ratio and supplies its output to an input terminal 22a of a 6-bit down counter 22 and also to an input terminal 23a of a control circuit 23. The signal supplied from the divider 21 is used as a clock signal of the system of FIG. 3 and the 6-bit down counter 22 increments its count in response to this frequency divided clock pulse and delivers a set of 64 different combinations of binary states on its output terminals 22b, 22c, 22d, 22e, 22f and 22g arranged in the order of the least significant bit to the most significant bit. Therefore, the terminal 22g, which is the most significant bit terminal, remains at high voltage level during the first half of the counter cycle and remains at low voltage level during the second half cycle. The output terminals 22b to 22f of the down counter 22 are connected respectively to data input terminals D1 to D5 of a latch circuit 24 whose inverted output terminals $\overline{Q1}$ to $\overline{Q5}$ are connected to respective terminals of a digital comparator 26 and whose $\overline{Q2}$ to $\overline{Q5}$ terminals are connected respectively to terminals A to D of the programmable divider 20. The digital comparator 26 receives its other input signals from the down counter 22 through its terminals 22b to 22f to compare the input and output binary data of the latch 24 and delivers a logic "1" to an input terminal 23c of the control circuit 23 when there is a coincidence between them.

The output terminals 22b to 22f of the down counter 22 are also coupled to a digital-to-analog converter 25 wherein the latch input binary data is converted into an analog voltage which is applied to the noninverting input of a voltage comparator 29. The voltage comparator 29 compares it with a setting voltage derived from a tap 28b of a potentiometer 28 which is connected between a voltage stabilizer 27 and ground. The D-A converter 25 is also powered from the voltage stabilizer 27 to minimize the effect of source voltage fluctuation by cancelling it in the comparator 29. The output of this comparator is at low voltage level when the analog voltage from the D-A converter 25 is lower than the setting level, presented at its inverting input, and switches to a high voltage condition in response to the analog voltage exceeding the setting level and supplies its output signal to an input terminal 23d of the control circuit 23.

The control circuit 23 comprises generally a 2-bit counter 70 including flip-flops 47 and 48 and a NAND gate 49 having its one input coupled to the Q output of flip-flop 48 and its other input connected to the $\overline{Q}$ output of flip-flop 47 to generate a low level output when the counter 70 has received two input pulses supplied through terminal 23a and through a NAND gate 46 and inhibits the latter in response to that low level output. An edge detector 71 is provided which comprises three NAND gates 52, 53 and 58 to generate a low level pulse in response to the voltage applied to terminal 23d changing from low to high voltage levels, that is, when the analog voltage from converter 25 exceeds the setting level. Another edge detector 72 includes three NAND gates 56, 57 and 60 which are similar in operation to the edge detector 71 and receives its input signal from terminal 22g of down counter 22 through input terminal 23b, and applies its low level output pulse through an inverter 61 for purposes of resetting the flip-flops 47 and 48 of the 2-bit counter 70. The control circuit 23 further includes a flip-flop 73 comprised of two NAND gates 54 and 59 each having the output terminal connected to an input of the other NAND gate. The NAND gate 54 receives its another signal from the digital comparator 26 through terminal 23c and delivers a high voltage output to an input of an Exclusive-OR gate 51 whose other input is connected to the output of voltage comparator 29 through terminal 23d. The NAND gate 59 receives its other input signal from the output of NAND gate 56 of edge detector 72 for purposes of resetting the flip-flop 73, that is, the output of NAND gate 54.

As will be described later in detail, the down counter 22 generates all "1"s binary data initially and decrements it in response to each input clock pulse received at terminal 22a until all "0"s appear at its terminals 22b to 22f and on the other hand, the D-A converter 25 provides inversion of the binary decreasing input data and generates an analog voltage which increases with time until the contents of the down counter 22 become all "0"s. Thus, if the voltage setting at the potentiometer 28 should deviate from the initial setting level to which the binary contents of the latch circuit 24 correspond, there will be a difference in voltage level between the output of voltage comparator 29 and the output of flip-flop 73, causing a high voltage output to appear at the output of Exclusive-OR gate 51 to activate an AND gate 55 when the latter is enabled in the presence of a high voltage signal from the terminal 22g of the down counter 22. During the time when the AND gate 55 is activated the flip-flops 47 and 48 of the 2-bit counter 70 are enabled to initiate counting operation.

The control circuit 23 further includes an OR gate 50 which takes its inputs from the terminal 22g of the down counter 22, the output of NAND gate 49 of counter 70 and from the output of edge detector 71 to generate a low level pulse when its inputs are all at logic "0"s for purposes of resetting the latch circuit 24 through terminal 23e to store the binary count of down counter 22. Since the output of 2-bit counter 70 remains at high output state if it receives only one clock pulse, the contents of latch circuit 24 remain unchanged if the fluctuation of the voltage at the terminal 28b of the analog setting potentiometer 28 remains within a range which corresponds to a range of ±1 clock pulse or discrete variation of ±1 binary digit in down counter 22. The latch 24 is reset only if the voltage deviation exceeds an amount corresponding to a range of ±2 clock pulses.

Figure 3:
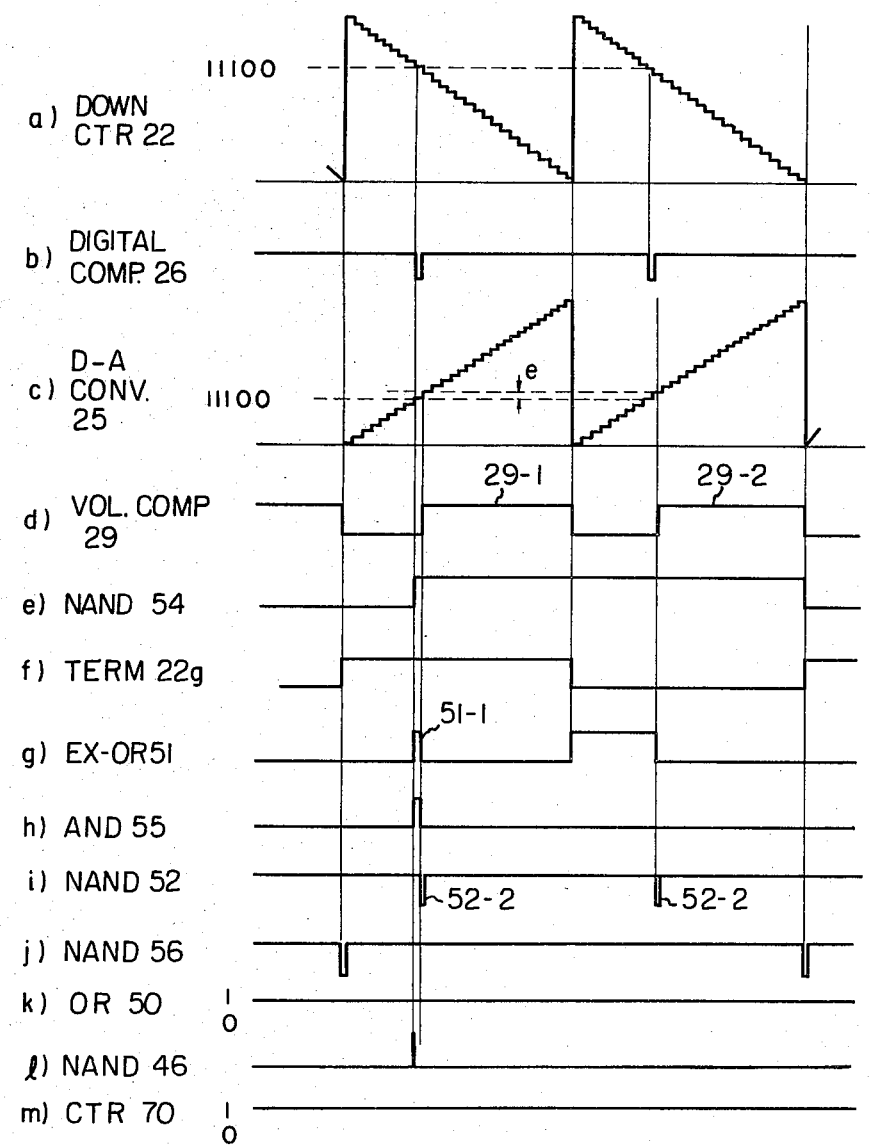
FIGS. 3a to 3m are a waveform diagram useful for describing the operation of the embodiment of FIG. 2 in cases where insignificant variations occur in the analog control signal.

This will be explained in more detail with reference to FIG. 3. Suppose that the logic states of the memory latch 24 are "1 1 1 0 0" which are the digital representation of the voltage given by the potentiometer 28, the inverted logic states "0 0 0 1 1" appear at the $\bar{Q}5$, $\bar{Q}4$, $\bar{Q}3$, $\bar{Q}2$ and $\bar{Q}1$ output terminals, respectively, so that the logic states of the program terminals D, C, B and A of the frequency divider 20 are respectively "0 0 0 1" which corresponds to a frequency division ratio of 1/99 (see Table I). FIG. 3a shows the digital value of the down counter 22 in analog form. A decrement of the down counter to a level corresponding to "1 1 1 0 0" which is now stored in latch 24 will cause the digital comparator 26 to produce a logic "0" pulse (FIG. 3b) which is coupled to terminal 23c to cause NAND gate 54 to deliver a logic "1" to Exclusive-OR gate 51. If there is no voltage drift on the potentiometer terminal 28b, the voltage comparator 29 will deliver a logic "1" almost at the same instant as the output from the digital comparator 26, so that the output of Exclusive-OR gate 51 will remain unchanged. If the potentiometer 28 has a voltage drift "e" (FIG. 3c) which corresponds to one clock pulse count, the analog comparator 29 will produce a high level output 29-1 a one clock period later than the time the output from the digital comparator 26 is delivered (FIGS. 3d and 3e) and Exclusive-OR gate 51 will produce an output pulse 51-1 (FIG. 3g) in the presence of a high voltage state of the MSB terminal 22g of the down counter 22 (FIG. 3f). As a result, AND gate 55 is activated (FIG. 3h) to enable the 2-bit counter 70 to receive one clock pulse through NAND gate 46 (FIG. 3i). Therefore, the logic "0" output state of the counter 70 remains unchanged (FIG. 3m) and the OR gate 50 also remains disabled (FIG. 3k) to prevent delivery of a latch resetting pulse 52-2 to the latch 24 which is generated by NAND gate 52 of edge detector 71 in response to the leading edge of the output 29-2 from the voltage comparator 29 (FIG. 3i) when the MSB terminal 22g of the down counter changes to logic "0" state during the second half period of the counter cycle. The logic state of the latch 24 thus remains unchanged regardless of a setting voltage variation if it lies within a range of analog equivalents of ±1 clock pulse count.

Figure 4:
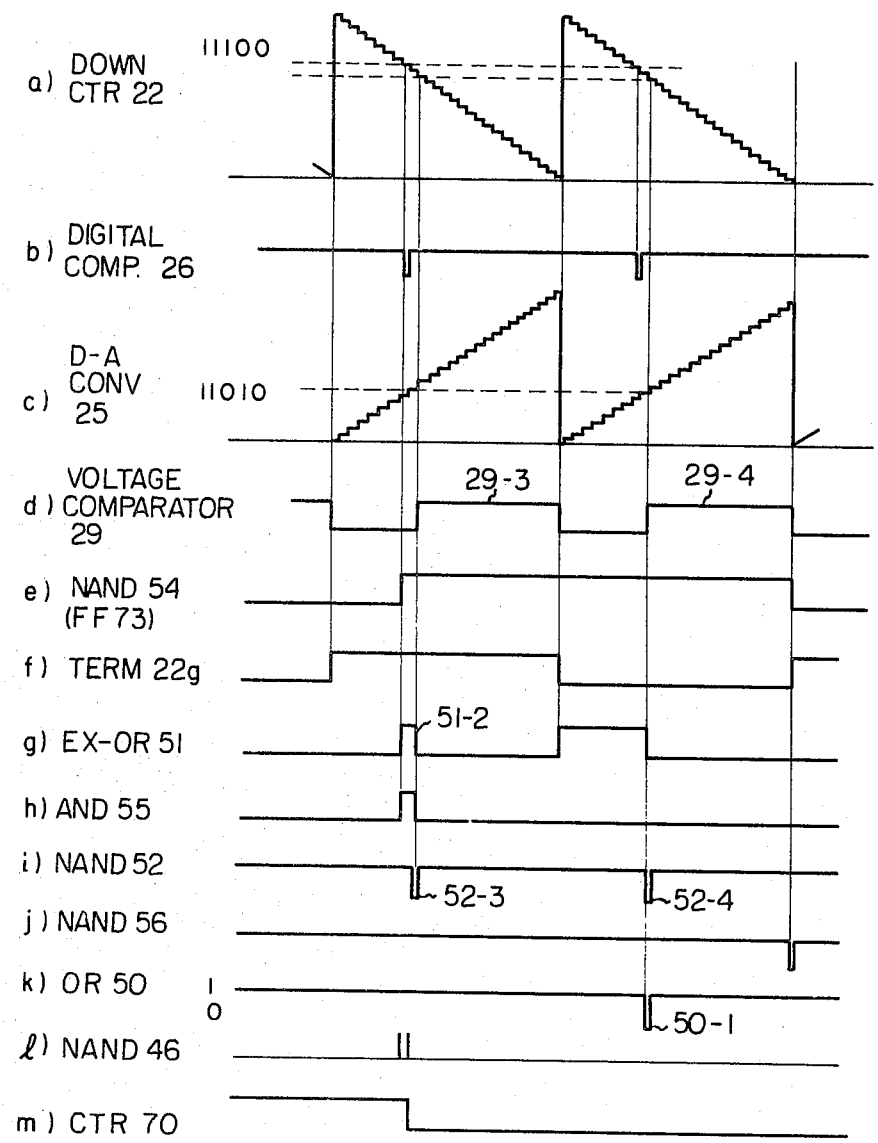
FIGS. 4a to 4m are a waveform diagram useful for describing the operation of the embodiment of FIG. 2 in cases where the analog control signal is varied manually for changing the frequency division ratio.

Assume that the potentiometer 28 is readjusted to a new value which corresponds to a digital value of "1 1 0 1 0". As illustrated in FIG. 4d, the voltage comparator 29 produce an output 29-3 in response to the analog equivalent of the digital output from the down counter 22 coinciding with the voltage at terminal 28b when the down counter 22 decrements to logic state "1 1 0 1 0" at a point in time delayed by the period of two clock pulses from the time of delivery of an output 26-1 from digital comparator 26 (FIG. 4b), so that Exclusive-OR gate 51 produce a high voltage pulse 51-2 of two-clock-pulse period to allow the 2-bit counter 70 to count two clock pulses, thus resulting in a low output voltage at the output of the counter 70 (FIGS. 4l and 4m). An output pulse 29-4 generated by the voltage comparator 29 during the second half period of the down counter cycle will cause a logic "0" output 52-4 to be present at the output of NAND gate 52 of edge detector 71. Since OR gate 50 is enabled by the low level output from the counter 70, it produces a latch resetting pulse 50-1 in response to the pulse 52-4 to reset the latch 24 to the logic state "1 1 0 1 0" and shifts the frequency division ratio to 1/98.

Figure 5:
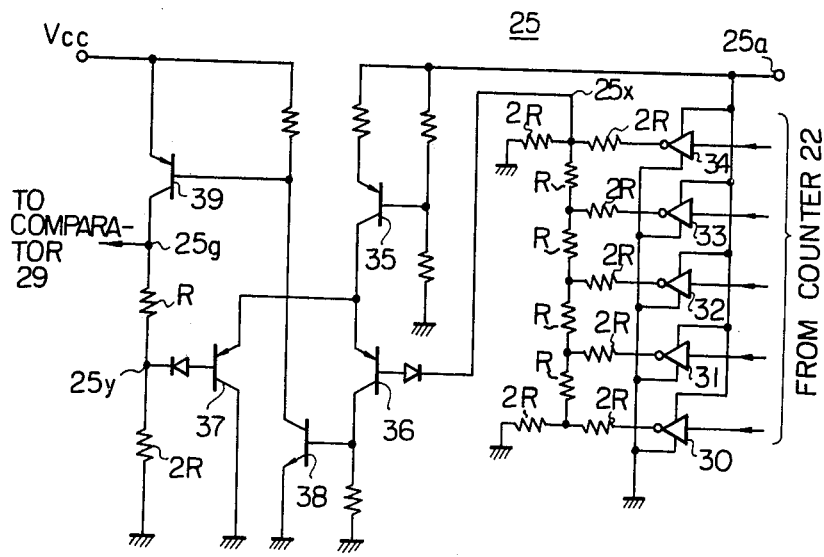
FIG. 5 in an illustration of details of the digital-analog converter of FIG. 2.

FIG. 5 illustrates details of the D-A converter 25 which includes a plurality of CMOS inverters 30 to 34 connected to receive binary signals through terminals 22b to 22f of the down counter 22, respectively, having their positive power supply terminals connected together to a terminal 25a which is connected to the stabilized voltage source 27. The respective output terminals of the inverters 30 to 34 are connected to a digital-analog conversion resistance network generally known as R-2R network. The output voltage developed between lead 25x and ground is approximately 2 Es/3 when all the input voltages to the inverters 30 to 34 are logic "0"s, where Es is the voltage at terminal 25a, and is zero when all the input voltages are logic "1"s. Therefore, the voltage at lead 25x varies 32 discrete steps in a range between zero and 2Es/3 in response to each clock pulse. The circuit including transistors 35 to 39 serves to multiply the voltage at point 25x by 3/2 so that the voltage at a circuit point 25g discretely varies between zero and Es. More specifically, transistor 35 forms a constant current source which together with transistors 36, 37 and amplifier transistor 38 forms a voltage comparator whose output is supplied to a supply voltage control transistor 39 so that the voltage at a circuit point 25y varies stepwisely in a range between zero and 2Es/3 and in response to this the voltage at point 25g varies in the range of from zero to Es.

Figure 6:
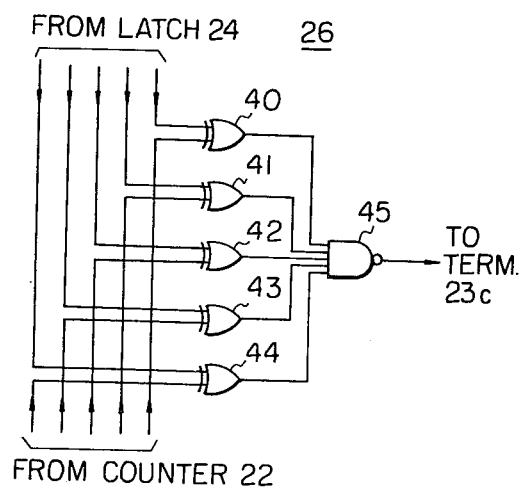
FIG. 6 is an illustration of details of the digital comparator of FIG. 2.

FIG. 6 is an illustration of details of the digital comparator 26 which, as shown, comprises a plurality of Exclusive-OR gates 40 to 44 each having their one input terminals connected respectively to the $\bar{Q}$ terminals of the latch 24 and have their another input terminals connected to the outputs of down counter 22 respectively. The output terminals of these Exclusive-OR gates are connected to a NAND gate 45 whose output is connected to terminal 23c of the control circuit 23. The NAND gate 45 thus delivers a logic "0" output when coincidence occurs between the logic states of the latch 24 and the logic states of the down counter 22.

The clock signal used to control the program input to the programmable frequency divider 20 may also be obtained from a suitable source independent from the input signal source 19. The operating frequency of the latch 24 and its associated circuitry is selected at a value much lower than the frequency of the standard frequency source 19. This allows the frequency divider 21 to be advantageously employed to reduce the standard frequency to the selected value. To minimize power consumption if the system is to be constructed of LSI circuitry, it is preferred that the operating frequency be as low as possible since the power consumption increases in proportion to the upper limit of the operating frequency.

The use of latch circuit 24 as a memory unit permits visual display of the output frequency value by operating the D-A converter 25, down counter 22, control circuit 23 and voltage comparator 29 on a time-sharing basis, and such time sharing operation would permit the counter 22 to be used for other purposes with a resultant decrease in number of the system components and a reduction of power consumption and manufacturing cost.

Another feature of the invention resides in the use of the stabilized voltage source 27 which supplies constant voltage to the D-A converter 25 and to the voltage setting potentiometer 28. Any voltage variation that occurs in the voltage stabilizer 27 will cause the voltages at the input terminals of the comparator 29 to vary by equal amounts so that such variations are cancelled out at the output of the comparator 29.

The foregoing description shows only preferred embodiment of the present invention. Various modifications are apparent to those skilled in the art without departing from the scope of the present invention. For example, a frequency multiplier may be constructed of a phase locked loop including the programmable frequency divider of the invention and a voltage controlled oscillator, whereby the output frequency of the voltage controlled oscillator varies in proportion to the adjustment of a potentiometer to derive a frequency-multiplied output. Therefore, the embodiment shown and described is only illustrative, not restrictive.

What is claimed is:

1. A digital frequency synthesizer having a programmable frequency divider for dividing the frequency of a standard frequency signal by a variable integral multiple, comprising, means for generating a manually adjustable analog control signal, analog-to-digital converter means for converting said analog control signal into a digital signal, and a storage medium for storing said digital signal, the output of said storage medium representing said integral multiple;

wherein said analog-to-digital converter means comprises means for detecting the difference between said analog control signal and the stored digital signal to reset said storage medium to the digital signal generated at the instant said difference exceeds a predetermined value; and further wherein said difference detecting means comprises:
a source of clock pulses;
a first binary counter receptive of said clock pulses to generate a digital signal varying stepwisely in response to each clock pulse, the output of said binary counter being connected to the input of said digital storage medium;
a digital comparator for generating an output signal in response to the occurrence of a coincidence between the input and output of said storage medium;
a digital-to-analog converter connected to the output of said binary counter to convert said digital signal into a corresponding analog signal;
an analog comparator for generating an output signal in response to the occurrence of a coincidence between said analog control signal and said analog signal delivered from said digital-to-analog converter; and
means for resetting said storage medium to store the instantaneous value of the digital signal generated by said first binary counter when the interval elapsed between the time of generation of an output signal of said digital comparator and the time of generation of an output signal of said analog comparator exceeds a predetermined value.

2. A digital frequency synthesizer as claimed in claim 1, wherein said resetting means comprises:
a second binary counter for generating an output signal in response to receipt of a predetermined number of said clock pulses when enabled;
an Exclusive-OR gate having a first input terminal connected to be responsive to the output of said analog comparator and a second input terminal connected to be responsive to the output of said digital comparator to generate an output signal for enabling said second binary counter; and
a control gate for applying an output signal from said analog comparator to said storage medium to reset the same in the presence of said output signal from said second binary counter.

3. A digital frequency synthesizer as claimed in claim 1, wherein said clock source comprises a standard frequency signal source to supply a standard frequency signal to said programmable frequency divider and a frequency divider having a fixed value of frequency division ratio connected to said standard frequency signal source to generate said clock pulses.

4. A digital frequency synthesizer as claimed in claim 1, further comprising a voltage source for supplying a voltage to said digital-to-analog converter so that the analog signal delivered therefrom varies in accordance with variation of said voltage supplied from said voltage source, and wherein said manually adjustable analog control signal generating means comprises a potentiometer connected to said voltage source to develop a voltage at the wiper terminal thereof which is also variable in accordance with voltage variation of said voltage source, said analog comparator includes a first input terminal connected to receive an analog signal from said digital-to-analog converter and a second input terminal connected to said wiper terminal of said potentiometer, whereby said voltage variation is cancelled in said analog comparator.

5. A digital frequency synthesizer as claimed in claim 4, wherein said voltage source is a voltage stabilized source.

6. A digital frequency synthesizer as claimed in claim 4, wherein said digital-to-analog converter comprises a resistance ladder network having a plurality of circuit nodes connected to receive said digital signal from said first binary counter and means for equalizing the maximum value of a voltage developed by said ladder network to the voltage supplied from said voltage source, said equalized output voltage of said ladder network being supplied to said first input terminal of said analog comparator.

7. A method for synthesizing a signal at a desired frequency using a programmable frequency divider adapted to receive an input standard frequency signal to deliver an output signal of which the frequency is the input frequency divided by a variable integral multiple, comprising:
(a) generating a manually adjustable analog control signal;
(b) generating a digital signal stepwisely varying in response to a clock pulse to represent a digital equivalent of analog sawtooth waves;
(c) storing the instantaneous value of said digital signal into a resettable storage medium;
(d) converting said digital signal into analog sawtooth waves;
(e) repeatedly comparing the instantaneous value of said analog converted sawtooth waves with said analog control signal to generate an output signal at one of two discrete values depending on whether said instantaneous value is above or below said control signal;
(f) repeatedly detecting a coincidence between the instantaneous value of said digital signal with the stored contents of said storage medium;
(g) repeatedly detecting the length of time between the generation of said output signal in the step (e) and the detection of said coincidence in the step (f); and
(h) resetting said storage medium, when said detected length of time is greater than a predetermined value, to store the instantaneous value of said digital signal generated in the step (c) in concurrence with an output signal subsequently generated in the step (e); and
(i) applying the digital signal stored in said storage medium to said programmable frequency divider to control the frequency thereof.

8. A digital frequency synthesizer having a programmable frequency divider for dividing the frequency of an input signal by a programming value, comprising:
means for generating a manually adjustable analog control signal;
analog-to-digital converter means for converting said analog control signal into a corresponding digital control signal;
a digital storage medium for storing said digital control signal therein for application to said programmable counter as said programming value; and
means for detecting the difference in value between said digital control signal at the output of said analog-to-digital converter means and said digital control signal stored in said storage medium for writing said digital control signal at the output of said converter means into said storage medium when said difference exceeds a predetermined value.

9. A digital frequency synthesizer comprising:
means for generating an analog control signal;
a binary counter for generating a digital signal in response to a clock pulse;
a digital storage medium which stores said digital signal in response to a reset signal applied thereto;
a programmable frequency divider for dividing the frequency of a standard frequency signal by the output of said digital storage medium;
a digital comparator for generating an output signal in response to the occurrence of a coincidence between the input and output of said storage medium;
a digital-to-analog converter connected to the output of said binary counter to convert said digital signal into a corresponding analog signal;
an analog comparator for generating an output signal in response to the occurrence of a coincidence between said analog control signal and said analog signal from said digital-to-analog converter; and
means for generating said reset signal when the interval between the time of generation of an output from said digital comparator and the time of generation of an output from said analog comparator exceeds a predetermined value.

10. A digital frequency synthesizer as claimed in claim 9, wherein said reset signal generating means comprises a second binary counter for generating an output signal in response to receipt of a predetermined number of clock pulses, an Exclusive-OR gate having a first input terminal connected to be responsive to the output of said analog comparator and a second input terminal connected to be responsive to the output of said digital comparator for generating an output signal for enabling said second binary counter to receive the clock pulses, and a control gate for applying an output signal from said analog comparator said storage medium to reset the same in the presence of said output signal from said second binary counter.

* * * * *